United States Patent
Shen

(12) 
(10) Patent No.: US 6,307,270 B1
(45) Date of Patent: Oct. 23, 2001

(54) ELECTRO-OPTIC DEVICE AND METHOD FOR MANUFACTURING THE SAME

(76) Inventor: Ming-Tung Shen, 4F, No. 52, Sec. 2, Chung-Shan N. Rd., Taipei City (TW)

( * ) Notice: Subject to any disclaimer, the term of this patent is extended or adjusted under 35 U.S.C. 154(b) by 0 days.

(21) Appl. No.: 09/401,099

(22) Filed: Sep. 22, 1999

(30) Foreign Application Priority Data

Aug. 5, 1999 (TW) ................................................ 88113398
Aug. 5, 1999 (TW) ................................................ 88213224

(51) Int. Cl.$^7$ .......................... H01L 23/48; H01L 23/52; H01L 29/40
(52) U.S. Cl. .......................... 257/783; 257/782; 257/784; 257/786
(58) Field of Search .................................... 257/690, 698, 257/700, 782, 783, 784, 786

(56) References Cited

U.S. PATENT DOCUMENTS

| | | | |
|---|---|---|---|
| 6,153,930 | * 11/2000 | Hori | 257/687 |
| 6,177,731 | * 1/2001 | Ishida et al. | 257/780 |
| 6,208,525 | * 3/2001 | Imasu et al. | 361/783 |
| 6,214,642 | * 4/2001 | Chen et al. | 438/108 |

* cited by examiner

Primary Examiner—Ngân V. Ngô
(74) Attorney, Agent, or Firm—Merchant & Gould P.C.

(57) ABSTRACT

An electro-optic device includes a transparent glass substrate, a dielectric tape layer and a semiconductor die. The glass substrate has a pad mounting surface with a plurality of first contact pads provided thereon. The dielectric tape layer has opposite first and second adhesive surfaces. The first adhesive surface is adhered onto the pad mounting surface of the glass substrate. The dielectric tape layer is formed with a plurality of holes at positions registered with the first contact pads. Each of the holes is confined by a wall that cooperates with a registered one of the first contact pads to form a contact receiving space. Conductive contacts are placed in the contact receiving spaces, respectively. The semiconductor die has a die mounting surface adhered onto the second adhesive surface of the dielectric tape layer. The die mounting surface is provided with a plurality of second contact pads that are bonded to the conductive contacts to establish electrical connection with the first contact pads. A method for manufacturing the electro-optic device is also disclosed.

15 Claims, 3 Drawing Sheets

ELECTRO-OPTIC DEVICE AND METHOD FOR MANUFACTURING THE SAME

BACKGROUND OF THE INVENTION

1. Field of the Invention

The invention relates to an electro-optic device, more particularly to an electro-optic device having a transparent glass substrate with circuit traces provided thereon, and to a method for manufacturing the electro-optic device.

2. Description of the Related Art

Electro-optic devices, such as a liquid crystal display panel, a charge-coupled device and a light emitting diode, generally include a transparent glass substrate having circuit traces provided thereon. Since the procedures for manufacturing a charge-coupled device and a liquid crystal display panel are generally similar, only the steps involved in the manufacture of a liquid crystal display panel will be described herein.

Referring to FIG. 1, a conventional liquid crystal display panel 1 is shown to comprise a transparent glass substrate 10, a plurality of integrated circuits 11, such as data driving or scan driving integrated circuits, and an integrated circuit controller 12 for controlling operation of the integrated circuits 11. The glass substrate 10 has a pad mounting surface 14 provided with a plurality of contact pads 13. The integrated circuits 11 are connected electrically to the contact pads 13, and the controller 12 is connected electrically to the integrated circuits 11 via wires 15 using known wire-bonding techniques.

Some of the drawbacks of the conventional liquid crystal display panel 1 are as follows:

1. An expensive wire-bonding machine is needed to establish connection among the integrated circuits 11, the controller 12 and the contact pads 13, thereby increasing the production costs. Also, defective products are produced during the wire-bonding operation due to inadequacies of the latter. Particularly, defective products are formed when wires break or fall out of alignment with the contact pads 13 during the wire-bonding operation, thereby reducing the production yield.

2. The wires 15 are susceptible to oxidation and corrosion because they are exposed to air, thereby affecting the reliability of the liquid crystal display panel 1.

3. Because of the arrangement of the glass substrate 10, the integrated circuits 11 and the controller 12, the liquid crystal display panel 1 has a relatively large thickness that cannot be reduced.

SUMMARY OF THE INVENTION

Therefore, the object of the present invention is to provide an electro-optic device and a method for manufacturing an electro-optic device capable of overcoming the aforesaid drawbacks that are associated with the prior art.

According to one aspect of the present invention, an electro-optic device comprises:

a transparent glass substrate having a pad mounting surface with a plurality of first contact pads provided thereon;

a dielectric tape layer having opposite first and second adhesive surfaces, the first adhesive surface being adhered onto the pad mounting surface of the glass substrate, the dielectric tape layer being formed with a plurality of holes at positions registered with the first contact pads, each of the holes being confined by a wall that cooperates with a registered one of the first contact pads to form a contact receiving space;

a plurality of conductive contacts placed in the contact receiving spaces, respectively; and a semiconductor die having a die mounting surface adhered onto the second adhesive surface of the dielectric tape layer, the die mounting surface being provided with a plurality of second contact pads that are bonded to the conductive contacts to establish electrical connection with the first contact pads.

According to another aspect of the invention, a method for manufacturing an electro-optic device comprises:

adhering a first adhesive surface of a dielectric tape layer onto a pad mounting surface of a transparent glass substrate, the dielectric tape layer being formed with a plurality of holes registered with first contact pads that are provided on the pad mounting surface, each of the holes being confined by a wall that cooperates with a registered one of the first contact pads to form a contact receiving space;

placing a plurality of conductive contacts in the contact receiving spaces, respectively; and adhering a die mounting surface of a semiconductor die onto a second adhesive surface of the dielectric tape layer opposite to the first adhesive surface, and bonding second contact pads that are provided on the die mounting surface to the conductive contacts to establish electrical connection with the first contact pads.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
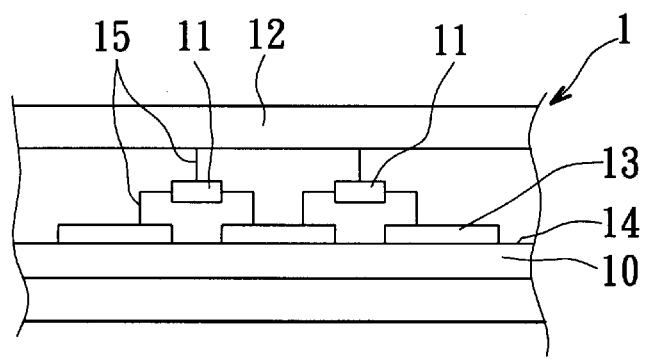
FIG. 1 is a fragmentary schematic view illustrating a conventional liquid crystal display panel.

Before the present invention is described in greater detail, it should be noted that like elements are denoted by the same reference numerals throughout the disclosure.

Figure 2:
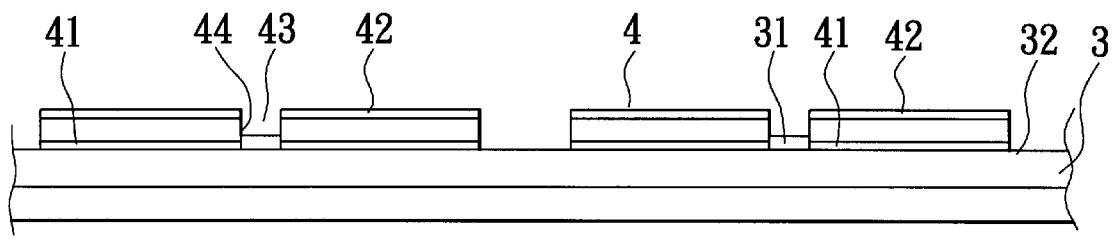
FIGS. 2 to 4 are fragmentary schematic views illustrating the steps of the method for manufacturing the first preferred embodiment of an electro-optic device according to the present invention.
Figure 3:
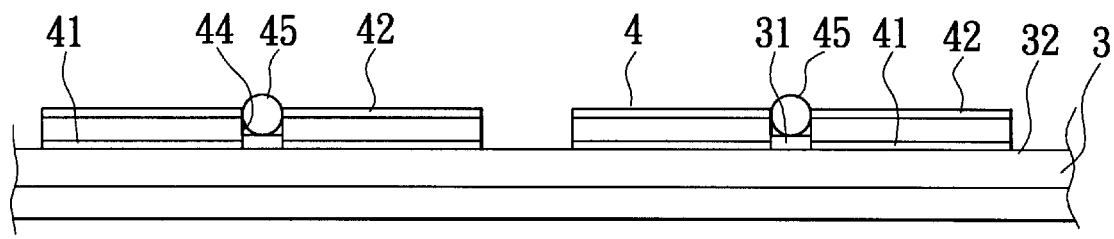
Figure 4:
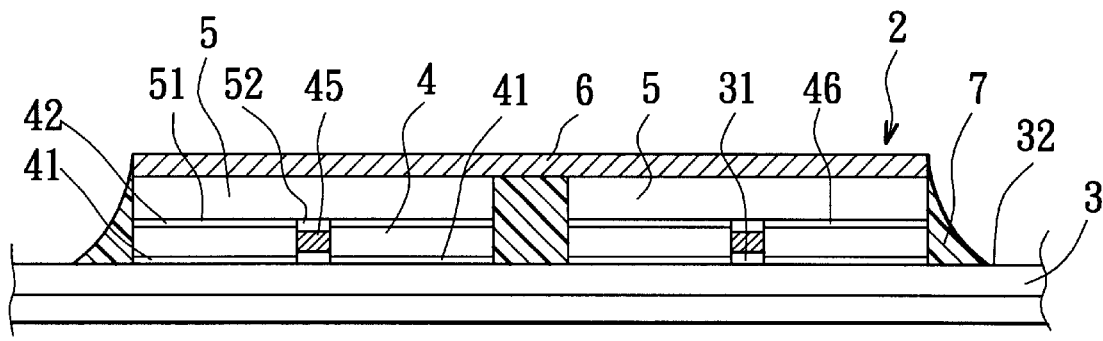

Referring to FIGS. 2 to 4, the first preferred embodiment of an electro-optic device according to the present invention is shown to be embodied in a liquid crystal display panel 2 which includes a transparent glass substrate 3 that is provided with circuit traces (not visible), a plurality of dielectric tape layers 4, and a plurality of semiconductor dice 5, such as data driving or scan driving integrated circuits.

The glass substrate 3 is a liquid crystal glass substrate and has a pad mounting surface 32 provided with a plurality of first contact pads 31 that are connected to the circuit traces. Each dielectric tape layer 4 has opposite first and second adhesive surfaces 41, 42. The first adhesive surface 41 of each dielectric layer 4 is provided with a heat-curable adhesive such that the first adhesive surface 41 can be adhered onto the pad mounting surface 32 of the glass substrate 3 during a heat curing operation. A conventional laser cutting technique is employed to form a plurality of holes 43 in the dielectric tape layers 4 at positions registered with the first contact pads 31 to expose the latter.

Each of the holes 43 is confined by a wall 44 that cooperates with a registered one of the first contact pads 31 to form a contact receiving space. Conductive contacts 45 are placed in the contact receiving spaces, respectively. In the first preferred embodiment, a tin ball is planted in each contact receiving space and serves as a conductive contact 45.

Each of the semiconductor dice 5 has a die mounting surface 51 provided with a plurality of second contact pads 52 that are to be connected to the conductive contacts 45. A heat curing operation is conducted to adhere the die mounting surface 51 of the semiconductor dice 5 onto the second adhesive surface 42 of the dielectric tape layers 4. Preferably, the second adhesive surface 42 is provided with a heat-curable adhesive 46 having a curing point that is lower than the melting point of the conductive contacts 45. Thus, the die mounting surface 51 of each semiconductor die 5 is already adhered onto the second adhesive surface 42 of the corresponding dielectric tape layer 4 prior to melting of the conductive contacts 45, thereby sealing the contact receiving spaces so that the melt of each conductive contact 45 is prevented from flowing out of the respective contact receiving space to avoid formation of undesired connections with adjacent conductive contacts 45.

In the first preferred embodiment, each semiconductor die 5 further has a heat dissipating surface opposite to the die mounting surface 51. A heat dissipating plate 6 is secured on the heat dissipating surface of the semiconductor dice 5 for heat dissipating purposes. Moreover, each semiconductor die 5 has a peripheral portion provided with an encapsulation layer 7, such as an epoxy resin layer, to strengthen bonding of the semiconductor die 5 with the pad mounting surface 32 of the glass substrate 3, and to form an airtight seal at the junction of the semiconductor die 5 and the corresponding dielectric tape layer 4 for protection purposes.

Figure 5:
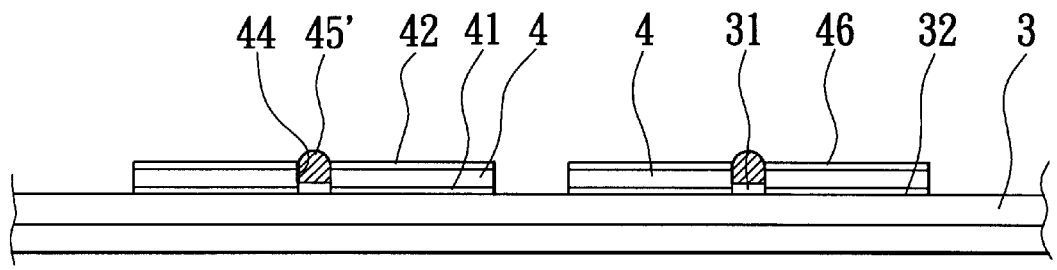
FIG. 5 is a fragmentary schematic view illustrating an intermediate product of the second preferred embodiment of a method for manufacturing an electro-optic device according to the present invention.

Referring to FIG. 5, in the second preferred embodiment of an electro-optic device according to the present invention, instead of using tin balls as conductive contacts, each contact 45' is formed from conductive paste, such as conductive silver paste.

Figure 6:
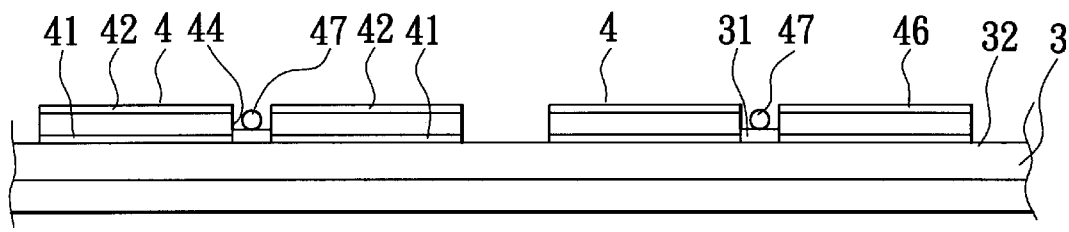
FIGS. 6 and 7 are fragmentary schematic views illustrating some of the steps of the method for manufacturing the third preferred embodiment of an electro-optic device according to the present invention.
Figure 7:
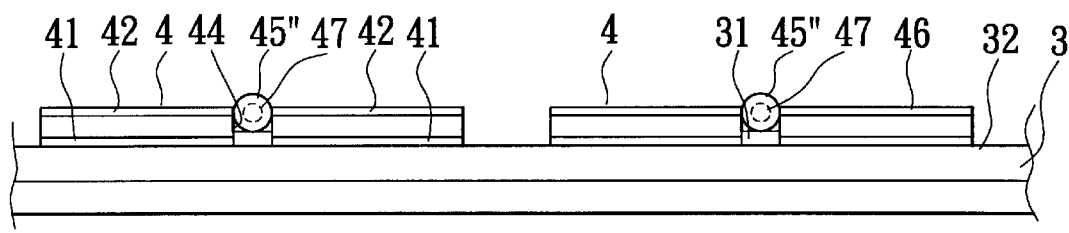

Referring to FIGS. 6 and 7, in the third preferred embodiment of an electro-optic device according to the present invention, each contact 45" is formed by placing a conductive metal material 47, such as a gold or aluminum ball, in each contact receiving space. A chemical electroplating process is subsequently performed to complete each contact 45" prior to bonding with the second contact pads on the semiconductor dice (not shown).

Figure 8:
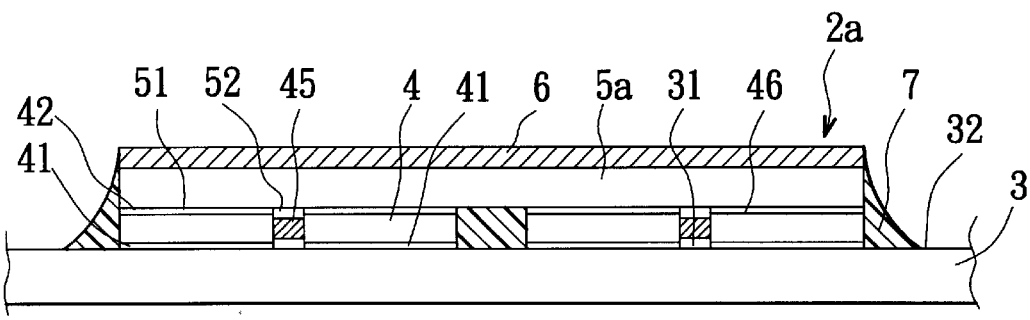
FIG. 8 is a fragmentary schematic view illustrating the fourth preferred embodiment of an electro-optic device according to the present invention.

Referring to FIG. 8, the fourth preferred embodiment of an electro-optic device according to the present invention is shown to be embodied in a charge-coupled device 2a which includes a transparent glass substrate 3 that is provided with circuit traces (not visible), and a plurality of semiconductor dice 5a, such as photo sensing dice and light emitting diodes, bonded onto the glass substrate 3 via a plurality of dielectric tape layers 4 in a manner similar to that of the previous embodiments. The dielectric tape layers 4 further form openings (not shown) to permit light that passes through the glass substrate 3 to reach the semiconductor dice 5a.

Some of the advantageous attributes of the electro-optic device 2, 2a according to this invention are as follows:

1. Instead of wires, conductive contacts 45, 45', 45" are used to establish electrical connection between the contact pads 31 on the glass substrate 3 and the contact pads 52 on the semiconductor dice 5, 5a. Since no wire-bonding machine is required, the production costs can be dramatically reduced. Moreover, the adverse effects of wire bonding on the production yield of the electro-optic device 2, 2a are also eliminated.

2. Because the conductive contacts 45, 45', 45" are sealingly confined by the semiconductor dice 5, 5a and the dielectric tape layers 4, and because of the additional sealing effect provided by the encapsulation layer 7, the conductive contacts 45, 45', 45" can be protected from oxidation and corrosion and can be prevented from forming undesired connections.

3. The heat dissipating plate 6 aids in heat dissipation of the semiconductor dice 5, 5a to prevent damage to the latter due to over-heating. Due to the presence of the heat dissipating plate 6 and the airtight confinement of the conductive contacts 45, 45', 45", the service life of the electro-optic device 2, 2a can be prolonged.

4. Because the conductive contacts 45, 45', 45" are in use, the distance between the semiconductor dice 5, 5a and the glass substrate 3 can be reduced. Since the semiconductor dice 5, 5a are all mounted on the glass substrate 3, the electro-optic device 2, 2a can have a relatively small thickness as compared to the aforementioned prior art.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. An electro-optic device comprising:

a transparent glass substrate having a pad mounting surface with a plurality of first contact pads provided thereon;

a dielectric tape layer having opposite first and second adhesive surfaces, said first adhesive surface being adhered onto said pad mounting surface of said glass substrate, said dielectric tape layer being formed with a plurality of holes at positions registered with said first contact pads, each of said holes being confined by a wall that cooperates with a registered one of said first contact pads to form a contact receiving space;

a plurality of conductive contacts placed in said contact receiving spaces, respectively; and a semiconductor die having a die mounting surface adhered onto said second adhesive surface of said dielectric tape layer, said die mounting surface being provided with a plurality of second contact pads that are bonded to said conductive contacts to establish electrical connection with said first contact pads.

2. The electro-optic device as claimed in claim 1, wherein said second adhesive surface is provided with a heat-curable adhesive having a curing point that is lower than melting point of said conductive contacts.

3. The electro-optic device as claimed in claim 1, wherein each of said conductive contacts is a tin ball.

4. The electro-optic device as claimed in claim 1, wherein each of said conductive contacts is formed from conductive paste.

5. The electro-optic device as claimed in claim 1, wherein each of said conductive contacts is formed from a conductive material that undergoes chemical electroplating prior to bonding with said second contact pads.

6. The electro-optic device as claimed in claim 1, further comprising a heat dissipating plate secured on a heat dissipating surface of said semiconductor die opposite to said die mounting surface.

7. The electro-optic device as claimed in claim 1, further comprising an encapsulation layer formed on a peripheral portion of said semiconductor die to strengthen bonding of said semiconductor die with said pad mounting surface of said glass substrate.

8. A method for manufacturing an electro-optic device, comprising:

adhering a first adhesive surface of a dielectric tape layer onto a pad mounting surface of a transparent glass substrate, the dielectric tape layer being formed with a plurality of holes registered with first contact pads that are provided on the pad mounting surface, each of the holes being confined by a wall that cooperates with a registered one of the first contact pads to form a contact receiving space;

placing a plurality of conductive contacts in the contact receiving spaces, respectively; and adhering a die mounting surface of a semiconductor die onto a second adhesive surface of the dielectric tape layer opposite to the first adhesive surface, and bonding second contact pads that are provided on the die mounting surface to the conductive contacts to establish electrical connection with the first contact pads.

9. The method as claimed in claim 8, wherein the second adhesive surface is provided with a heat-curable adhesive having a curing point that is lower than the melting point of the conductive contacts, and adhering of the semiconductor die onto the dielectric tape layer and bonding of the second contact pads to the conductive contacts are performed simultaneously through a heat curing operation such that the die mounting surface is already adhered onto the second adhesive surface prior to melting of the conductive contacts.

10. The method as claimed in claim 8, wherein adhering of the dielectric tape layer onto the glass substrate is accomplished by heat curing of a heat-curable adhesive provided on the first adhesive surface.

11. The method as claimed in claim 8, wherein each of the conductive contacts is a tin ball.

12. The method as claimed in claim 8, wherein each of the conductive contacts is formed from conductive paste.

13. The method as claimed in claim 8, wherein each of the conductive contacts is formed from a conductive material that undergoes chemical electroplating prior to bonding with the second contact pads.

14. The method as claimed in claim 8, further comprising the step of securing a heat dissipating plate on a heat dissipating surface of the semiconductor die opposite to the die mounting surface.

15. The method as claimed in claim 8, further comprising the step of forming an encapsulation layer on a peripheral portion of said semiconductor die to strengthen bonding of said semiconductor die with said pad mounting surface of said glass substrate.

* * * * *